US005508661A

United States Patent [19]

Keane et al.

[11] Patent Number: 5,508,661

[45] Date of Patent: Apr. 16, 1996

[54] FAST TUNING YIG FREQUENCY SYNTHESIZER

[75] Inventors: William J. Keane, San Jose; Christopher F. Schiebold, Palo Alto, both of Calif.

[73] Assignee: Litton Industries, San Jose, Calif.

[21] Appl. No.: 346,337

[22] Filed: Nov. 29, 1994

Related U.S. Application Data

[63] Continuation of Ser. No. 983,643, Dec. 1, 1992, abandoned, which is a continuation-in-part of Ser. No. 783,455, Oct. 24, 1991, Pat. No. 5,221,912.

[51] Int. Cl.[6] .......... H03B 19/00

[52] U.S. Cl. .......... 331/37; 331/43; 331/19; 331/96; 331/179; 327/105; 455/313; 455/315; 364/721

[58] Field of Search .......... 331/2, 37, 38, 331/39, 40, 41, 42, 43, 25, 19, 96, 179; 328/14, 15, 16, 17, 18; 455/313, 315, 323, 260; 327/105, 106, 107; 333/202 M; 364/721

[56] References Cited

U.S. PATENT DOCUMENTS

| | | | |
|---|---|---|---|
| 3,777,271 | 12/1973 | Telewski | 328/16 |
| 4,105,949 | 8/1978 | Hardin | 331/37 |
| 4,791,377 | 12/1988 | Grandfield et al. | 328/14 |
| 4,926,130 | 5/1990 | Weaver | 328/14 |
| 5,166,629 | 11/1992 | Watkins et al. | 328/14 |

FOREIGN PATENT DOCUMENTS

| | | | |
|---|---|---|---|
| 0348283 | 12/1989 | European Pat. Off. | 328/16 |

*Primary Examiner*—Robert J. Pascal
*Assistant Examiner*—Arnold Kinkead
*Attorney, Agent, or Firm*—Ronald Craig Fish; Falk, Vestal & Fish

[57] ABSTRACT

A frequency synthesizer using a fixed oscillator driving a comb line generator to generate a spectrum of comb lines, one of which is selected by a switched array of fixed-tuned, YIG passband filters. The selected comb line is combined in a mixer with a signal from a local oscillator, which, preferably, is a direct digital synthesizer. The output of the mixer is fed to another switched array of fixed-tuned YIG passband filters where only the desired sideband is selected and the comb line and the other sideband is filtered out. In various alternative embodiments, tunable YIG filters are substituted for each array. Some embodiments also use a reverse slope equalizer to break up the coherent energy in the comb line spectrum at the output of the comb line generator to allow RF amplification to be applied without saturating the amplifier.

8 Claims, 10 Drawing Sheets

FAST TUNING YIG FREQUENCY SYNTHESIZER

This is a continuation application of a U.S. patent application Ser. No. 07/983,643, filed Dec. 1, 1992, now abandoned, which is a continuation-in-part of a U.S. patent application filed Oct. 24, 1991, Ser. No. 07/783,455, now U.S. Pat. No. 5,221,912.

BACKGROUND OF THE INVENTION

The invention pertains to the field of YIG tuned frequency synthesizers. More particularly, the invention pertains to the field of switched YIG direct synthesizers for generating low noise, nanosecond tuned microwave signals.

In the field of microwave components, small size, low power dissipation, very fast tuning speeds, low phase noise and low unit cost are very important characteristics. Frequency synthesizers in the microwave components area are devices that generate signals at tunable frequencies with a high degree of accuracy. It is highly desirable to be able to rapidly tune the frequency of the frequency synthesizer and to continually sweep the frequency of the output signal throughout the range of frequencies that can be generated. Generally, the output frequency of the frequency synthesizer is used as the local oscillator signal in a superhetrodyne receiver or other apparatus where a local oscillator or variable frequency source is needed.

An embodiment of a prior art synthesizer, which is believed to be the closest known prior art to the invention claimed herein, was marketed by ESSI of Fremont, Calif. in 1990 and earlier under the model number ER 3300 and ER 3400. In this embodiment, a 500 MHz surface acoustic wave oscillator, fed a power amplifier which fed a step recovery diode comb line generator. A reverse slope equalizer equalized the power in the comb lines and had its output coupled to a power divider which divided the power between two tunable FERRETRAC™ YIG passband filters of the type described in U.S. Pat. No. 4,127,819, the contents of which are hereby incorporated by reference. These tunable filters were used in ping-pong fashion to select alternate comb lines for coupling to a mixer. The output of the filters were coupled through switchable power amplifiers to implement an output switch to a power divider to match the amplifiers and thence to a mixer. The mixer also received a local oscillator signal from a voltage controlled oscillator having an output frequency range from 250–500 MHz. The mixer up converted the selected comb line and output two sideband frequencies and the "carrier" to a power amplifier. These signals were coupled to the input of another FERRETRAC YIG passband filter which selected the desired sideband signal. The output of the filter was then amplified and made available for use as a synthesized signal.

In another embodiment in the prior art, a YIG frequency synthesizer is comprised of a YIG oscillator in a phase locked loop with a feedback path back to the oscillator from the output. A sample of the output frequency of the YIG oscillator is mixed with a selected comb line frequency to generate an intermediate frequency that is compared with an intermediate frequency in a phase detector to generate an error signal which is fed back to control the frequency of the YIG oscillator. The comb line frequency was generated by a YIG filter coupled to the output of a step recovery diode driven by a source,oscillator. The step recovery diode generates a spectrum of harmonics, one of which was selected by a tunable YIG passband filter for application to the mixer.

Fine tuning of the output frequency is achieved by changing the frequency of the reference oscillator.

This type of frequency synthesizer, manufactured by Hewlett Packard and others, is very slow, having a tuning speed of around 10–50 milliseconds. The basic problem with this architecture is that it cannot be tuned continuously throughout the range nor can it be tuned rapidly. The bandwidth of the feedback loop is narrow which prevents rapid changes of the YIG oscillator frequency. To get around this problem, this type filter is normally tuned with the feedback loop open to get the YIG oscillator approximately at the desired frequency, and then the feedback loop is closed. Upon closure, the YIG oscillator takes 10–50 milliseconds to stabilize at some frequency which may be the incorrect frequency and which may need further adjustment. Further millisecond delays may be imposed by the need to alter the center frequency of the YIG passband filter to select a new comb line. Because of the need to open the feedback path, the output frequency cannot be continuously altered throughout the range of possible output frequencies.

Another type of frequency synthesizer exists in the prior art which can tune faster than the preceding examples of prior art. These types of frequency synthesizers, typified by the devices manufactured by Comstron of Long Island, N.Y., use a multiply and divide architecture to manipulate a base frequency up or down to the desired frequency. Comstron units are available which can switch frequencies in from 1 microsecond to 100 nanoseconds. Unfortunately this type of frequency synthesizer is very large and heavy and can weigh as much as 50 pounds. Also, these type units are very expensive.

Conventional broadband microwave synthesizers are rack mounted instruments weighing 50 pounds or more and consume hundreds of watts of power.

Therefore, a need has arisen for a new type of small, low cost, low power consumption frequency synthesizer which can change frequencies very fast, i.e., on the order of one microsecond or faster with a very broad range of output frequencies, and having high selectivity, high rejection of unwanted signals and excellent frequency resolution.

SUMMARY OF THE INVENTION

According to the teachings of the invention, there is disclosed, in the preferred embodiment, a YIG-tuned direct synthesizer using a direct digital synthesizer (hereafter sometimes called a DDS) and having a tuning speed of less than 100 nanoseconds. A 500 MHz Surface Acoustic Wave (SAW) oscillator generates a sine wave output which drives a step recovery diode to generate a spectrum of harmonics. One of these harmonics is selected by a switched array of fixed-tuned YIG passband filters, each of which is tuned to pass one harmonic only. The selected harmonic is used to frequency translate the output of a Direct Digital Synthesizer (DDS) operating in the 250 MHz to 500 MHz range. By modulation of the DDS output frequency with a selected comb line from the SAW, output frequencies in the 5 to 10 GHz range can be achieved with low phase noise. The nanosecond tuning capability of the DDS allows the frequencies between the comb line harmonics to be rapidly filled in so as to be able to rapidly sweep or jump about in frequency across a very wide range of frequencies.

The basic structure of the preferred embodiment according to the teachings of the invention includes a SAW oscillator which generates a high level sine wave at a fixed frequency of 500 MHz. This sine wave is used to drive a step-recovery diode in a comb line generator which generates low spurious, low phase noise comb lines in the 5–10 Ghz range separated by 500 MHz. Typically, the spurious content is less than −80 dbC in this arrangement. A particular comb line is selected by a first YIG filter array coupled to the output of the comb line generator. This first filter array is comprised of a plurality of switched, fixed-tuned, bandpass YIG filters, each of which is preferably permanent magnet biased to have a center frequency at the frequency of a different one of said comb lines but which may also be electromagnet biased. In other embodiments, other types of fixed tuned filters may also be used, but YIG filters are preferred because of their small size and high Q factor. The particular comb line desired is selected by switching to the appropriate YIG bandpass filter having the frequency of the desired comb line within its bandpass range so as to pass that comb line to the mixer.

The output signal from the first YIG tuned bandpass filter array is coupled to one input of a mixer. The other input of the mixer is driven by a fast switching DDS which generates a variable frequency local oscillator signal in the range from 250–500 MHz. The mixer output then contains three signals: the desired frequency to be synthesized as one sideband of the comb line/DDS local oscillator signal combination; the original comb line; and, an unwanted sideband. This combination of signals is applied to a second switched, fixed-tuned, YIG bandpass filter array like the array previously described. The second array is switched so that the bandpass filter having the desired frequency within its passband is switched so as to select the desired sideband frequency and pass it to the output while rejecting the comb line and the unwanted sideband. The unwanted components are rejected by greater than 45–60 dB depending upon the performance of the DDS. Current DDS's are capable of output of the desired local oscillator signal with other spurious signals attenuated by about 45 db. Future DDS circuits will probably be able to attenuate the spurious signals by about 60 dB or more.

The second filter array also removes the unwanted harmonics and sideband in the mixer output.

In another important embodiment, a SAW oscillator is used to drive a step recovery diode to generate a plurality of comb lines, preferably separated by 500 MHz.

An array of at least two variable frequency YIG passband filters which can be selectively coupled to the step recovery diode is used to select the particular comb line for coupling to a mixer. Each of the YIG passband filters is tuned to have a center frequency centered on a desired comb line, but not all comb lines need have filters present if not all comb lines will be used.

The output of the switched filter array is coupled to a mixer, the other input of which is coupled to a local oscillator signal generated by a DDS. The DDS has its frequency altered such that when the DDS frequency and the selected comb line are added, the desired resulting output signal is generated as one of the sidebands.

The output of the mixer is then coupled to the output through another switched array of variable frequency YIG filters each of which has its center frequency tuned to the center frequency of a desired sideband of a desired comb line. The output of this second array is used as the synthesizer output signal.

Another important embodiment, uses a 400 MHz sine wave signal source to drive a step recovery diode to generate a plurality of comb line harmonics separated by 400 MHz covering a 5–10 GHz array. The harmonics are input to a first switched array of five tunable YIG passband filters which are used to select the desired comb line for input to the mixer. The selected comb line is then mixed with a local oscillator signal from a 200–400 MHz DDS so as to fill in the frequencies between the comb lines. By selection of the proper comb line and DDS frequency, any desired frequency between 5–10 GHz can be generated in continuous coverage of the range. A switched array of five tunable YIG passband filters are then used to select the desired sideband. The use of five YIG filters for the input and output arrays is purely arbitrary based upon a need to switch rapidly between synthesis any one of five frequencies in the 5–10 GHz range. Switching speed of this embodiment is typically 100 nanoseconds assuming the YIG filters do not have to be altered. This switching speed is primarily established by the propagation delay of the YIG filters.

Numerous other alternative embodiments are also disclosed herein.

All three of the above described embodiments and many of the other alternative embodiments are smaller, cheaper, lighter and faster in switching speed than the prior art variable frequency microwave signal synthesizers. Because there is no feedback path with narrow bandwidth, there is no "open loop slewing of frequency" as is found in the Hewlett Packard embodiments and no settling time after the feedback path is closed once the approximate desired frequency is achieve. Because the output frequency is principally determined by the switching of the input filter array (nanoseconds) and the tuning speed of the DDS (nanoseconds) or the VCO (approximately 1 microsecond), overall switching speed is much faster.

DETAILED DESCRIPTION OF THE PREFERRED EMBODIMENT

Figure 1:
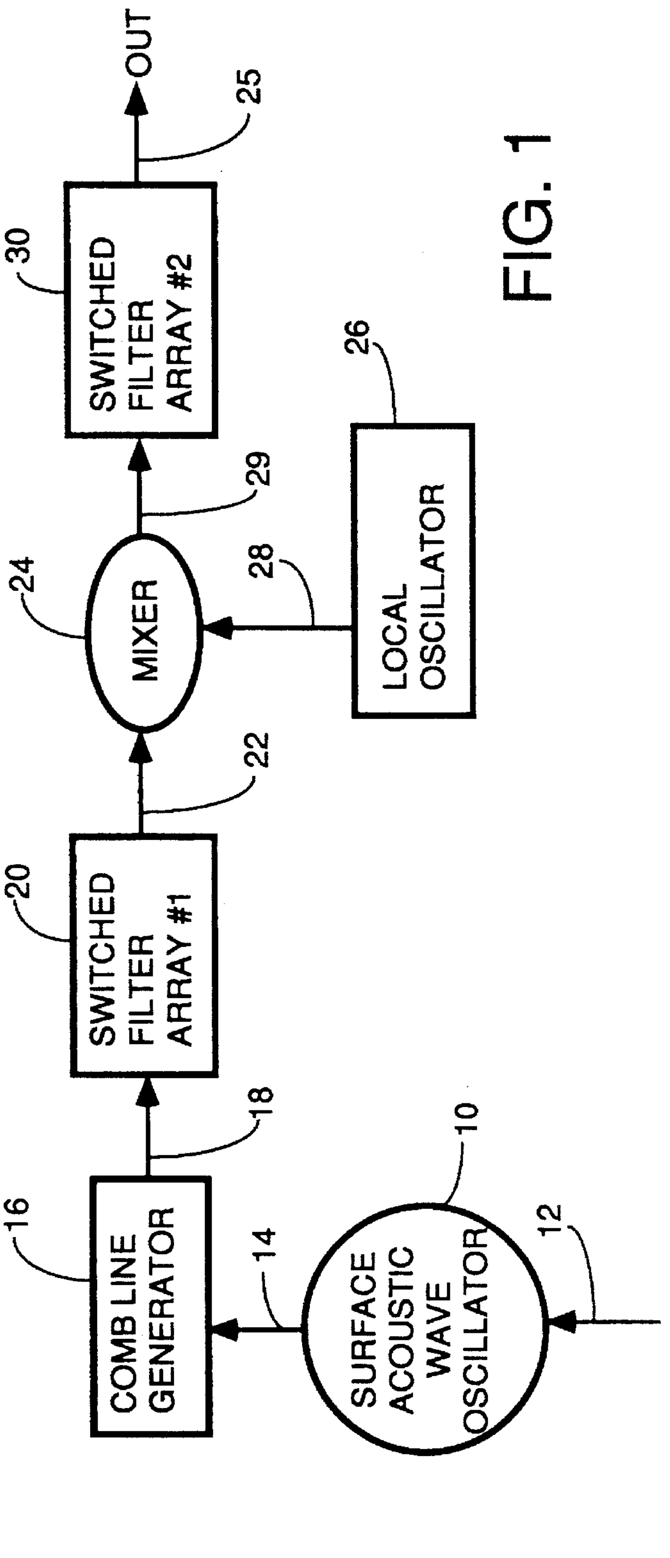
FIG. 1 is a block diagram of the preferred embodiment of a direct frequency synthesizer.

Referring to FIG. 1, there is shown a block diagram of the preferred embodiment of the frequency synthesizer according to the teachings of the invention. A conventional surface acoustic wave oscillator 10 (hereafter SAW) phase locked to an external 10 MHz crystal generated reference signal on line 12 generates a 500 MHz sine wave signal on line 14. In alternative embodiments, the reference signal on line 12 can be internally generated. SAW oscillators are preferred because of their extremely low phase noise performance. Phase noise is the noise at the base line of an oscillator output spectrum. It is important to keep the phase noise as low as possible for the SAW because this phase noise will be increased by 6 dB per octave in the multiplication process. Therefore, in order to achieve −90 dbC/Hz of phase noise at 100 KHz offset from the carrier at 10 GHz, the noise of the SAW oscillator at 500 MHz should be 26 dB lower, or −116 dbC/Hz.

The purpose of the sine wave drive signal on line 14 is to drive a step recovery diode (not separately shown) in comb line generator 16. The comb line generator 16 is conventional in design consisting of only a step recovery diode. The purpose of the comb line generator is to generate harmonics of the 500 MHz sine wave on line 14. Each harmonic will be referred to herein as a comb line. These harmonics or comb lines and the fundamental frequency of 500 MHz will appear on line 18 at the signal input of a switched YIG filter array #1 symbolized by box 20.

In the embodiment disclosed here intended for synthesis of signals from the 5–10 GHz range, the use of a reverse slope equalizer is not necessary because the benefits thereof are outweighed by the loss of power therein. However, in embodiments where synthesis of signals over a decade frequency range as opposed to over an octave is desired, the use of the reverse slope equalizer is preferred. The reverse slope equalizer has the insertion loss characteristics shown in FIG. 12. It is inserted so as to attenuate some of the comb line frequencies more than others, i.e., it is placed after the step recovery diode. The resulting comb line spectrum is as shown in FIG. 13.

The first switched YIG filter array 20 contains a plurality of fixed-tuned, permanent magnet biased, YIG bandpass filters, each of which has a passband designed to encompass one of the comb lines or harmonics appearing on line 18. In other embodiments, the filters may be variable frequency YIG passband filters, each of which is fixed-tuned to the frequency of a particular comb line. The purpose of the switched YIG filter array 20 is to enable a user to select one of the comb lines on line 18 for transmission to the output line 22 while filtering out all other comb lines. The selected comb line on line 22 acts as a "coarse tuning" selection or a platform from which the final frequency adjustment to the desired output frequency can be made. In other words, if the desired comb frequency is 5 GHz, the tenth harmonic of the SAW fundamental frequency at 500 MHz would be selected by the switched filter array 20. If some output frequency at output node 25 slightly above or below 5 GHz is needed, a local oscillator signal on line 28 having a frequency equal to the delta or difference between 5 GHz and the desired frequency will have to be mixed in with the tenth harmonic.

Figure 12:
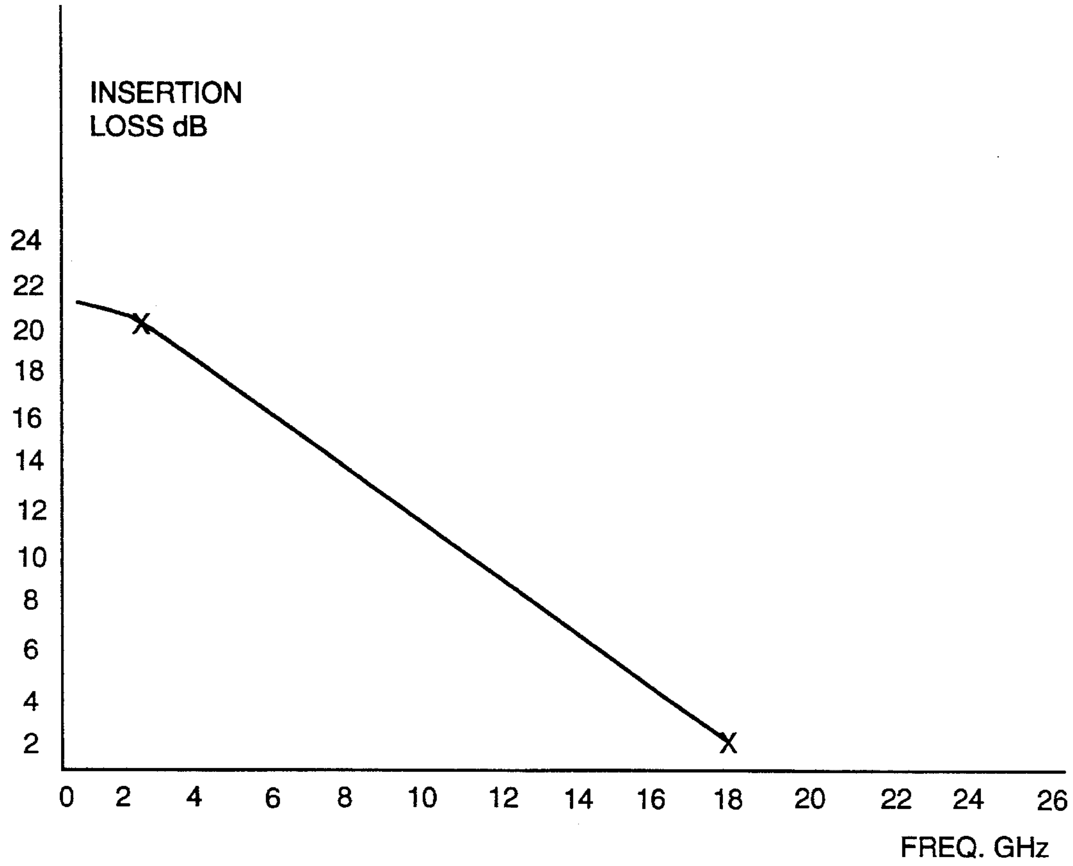
FIG. 12 is a diagram of the frequency response characteristic of a reverse slope equalizer.
Figure 13:
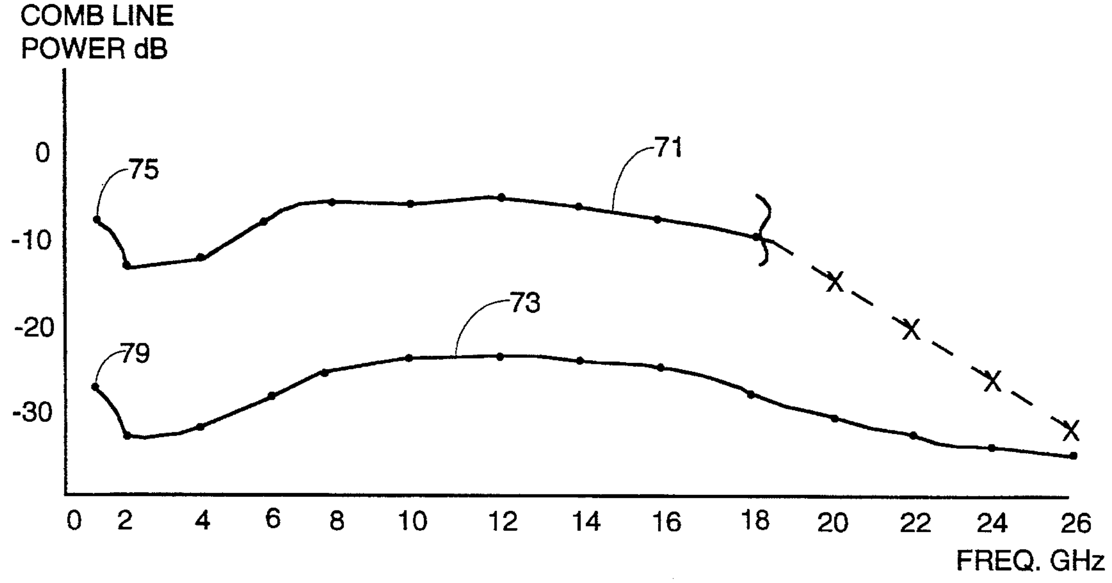
FIG. 13 power spectrum diagram showing the relative power in the comb lines from the step recovery diode (SRD) after passing through a reverse slope equalizer.

Each YIG passband filter can have the structure of any of the YIG passband filters in the prior art such as the passband filters described in FIGS. 12 and 13 of U.S. Pat. No. 4,179,674, the entire disclosure of which is hereby incorporated by reference. Sharper rolloff characteristics for each filter can be obtained by using more YIG spheres coupled between the input and output lines as illustrated in FIG. 13 of U.S. Pat. No. 4,179,674. Other bandpass filter structures which can be used to construct the YIG passband filter arrays are disclosed in U.S. Pat. Nos. 4,247,837 (FIGS. 3, 5 and 6), U.S. Pat. No. 4,480,238 which also are incorporated by reference herein.

Figure 8:
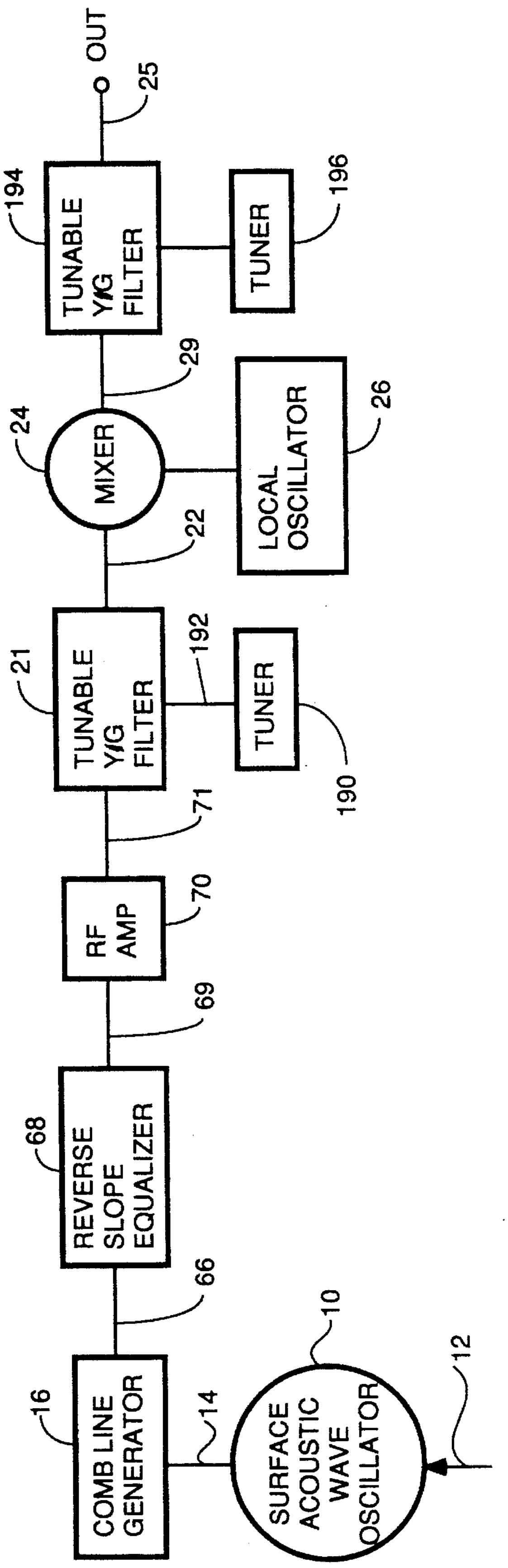
FIG. 8 is a block diagram of an alternative embodiment wherein two tunable YIG filters are substituted for the switched, fixed-tuned YIG filter arrays 20 and 30 in FIG. 1.

In the preferred embodiment, the YIG passband filter array has one filter per comb line, i.e., harmonic frequency generated by the comb line generator 16. In alternative embodiments, the YIG filter arrays 20 and 30 could each be a filter as symbolized in FIG. 2. In this embodiment, the YIG filter arrays 20 and in FIG. 1 are each replaced by a tunable YIG passband filter 21 which can be tuned via a tuning signal on line 23 from a tuning circuit (not shown) to move its passband to encompass the center frequency of the desired comb line. In other words, a single tunable YIG filter is substituted for the switchable array of fixed-tuned YIG filters 20 such that a single comb line can be selected by tuning the passband of the filter to encompass the desired harmonic. Also, a single tunable YIG passband filter is substituted for the switched array of fixed-tuned YIG passband filters 30 such that the desired sideband resulting from the mixing operation can be selected by tuning the YIG filter passband to encompass the desired sideband. Such an embodiment is shown in FIG. 8.

Tunable passband filters are known in the prior art, and any known or later developed tunable YIG filter which can tune throughout the 5–10 GHz range will suffice for purposes of practicing the invention. Multi-sphere YIG stopband filters of a very compact design are disclosed in U.S. patent application YIG TUNED HIGH PERFORMANCE BAND REJECT FILTER, Ser. No. 07/783,455, filed 10/24/91 by Bill Keane and Christopher Schiebold (hereafter the parent application). The full loop coupling structure with linear arrays of YIG spheres and multiple linear arrays of YIG spheres in the same tuning magnet flux gap disclosed in the parent application can be adapted by those skilled in the art to a passband structure to build a very compact, fast tuning, low spurious, very selective YIG passband filter which can tune from 4–18 GHz for purposes of practicing the invention disclosed herein. Multiple YIG passband filters can be built using a passband adaptation of the compact structure of the Parent application for the YIG passband filter arrays 20 and 30 in FIG. 1 and permanent magnet tuning bias may be used, with each YIG filter having its permanent magnet tuning bias set so as to establish its passband at a frequency range to encompass a selected comb line.

A mixer and a local oscillator 26 are used to perform the fine tuning process of mixing a local oscillator signal with the harmonic to achieve the desired output frequency. The mixer 24 is a conventional mixer apparatus as is used in any superhetrodyne receiver operable in the 5–10 GHz range. Typically such mixers are diodes driven into their nonlinear range by the signals to be mixed, The harmonic selected by the first switchable passband filter array 20 arrives on line 22 whereas the local oscillator signal which is to be mixed arrives on line 28. The local oscillator signal has a frequency which is equal to the difference between the desired output frequency to be synthesized and the frequency of the selected comb line on line 22.

The process of selecting a comb line close to the desired output frequency to be synthesized and then modifying its frequency by mixing it with a local oscillator frequency, retains the phase noise of the local oscillator signal.

The local oscillator 26 is preferably a small, fast tuning digital direct synthesizer (hereafter DDS) that tunes from 250–500 MHz with phase noise characteristics consistent with the multiplied phase noise levels of the surface acoustic wave oscillator 10 and tuning speeds of less than 100 nanoseconds. The best mode currently known for practicing the invention is to use local oscillators that tune from 250–500 MHz which tune to new frequencies in the "one-microsecond-or -less" range. Such devices are commercially available from Comstron of Long Island, N.Y. or PTS in Boston, Mass. In alternative embodiments, the SAW oscillator can output a 250 MHz sine wave so as to generate 250 MHz comb line spacing. In this embodiment, small, commercially available, fast tuning DDS oscillators that tune up to 250 MHz can be used. In other embodiments, the SAW frequency can be set at 400 MHz and commercially available DDS that tune up to 400 MHz can be used. Likewise, a SAW frequency of only 100 MHz could be used, and very small, very fast commercially available DDS devices that tune from 50–100 MHz could be used. However, in these embodiments, more YIG tuned, passband filters need to be used to select the desired comb line and this increases the cost of the system. DDS devices of these types are available from Stanford Telecommunications of Santa Clara, Calif. and Sciteq of San Diego, Calif.

Current DDS technology and research is focussing on GHz clock speeds and nanosecond tuning capability. The preferred embodiment will have a switching speed of 10–20 nanoseconds.

The mixer 24 is a conventional structure known in the prior art.

The bandwidth of the passband filters in the YIG filter arrays 20 and 30 is typically 30–40 MHz in the preferred embodiment, and such YIG tuned passband filters are known in the prior art.

Figure 2:
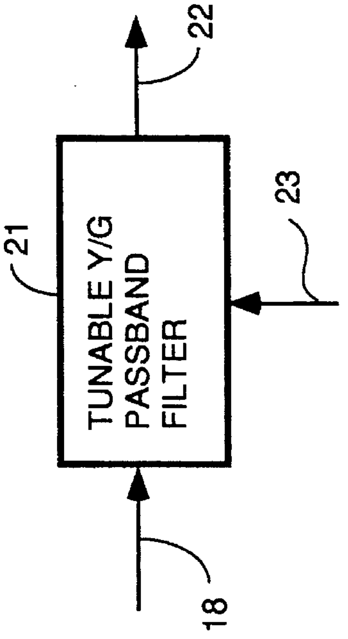
FIG. 2 shows the preferred embodiment of an input stage for the class of embodiments shown in FIG. 1.
Figure 3:
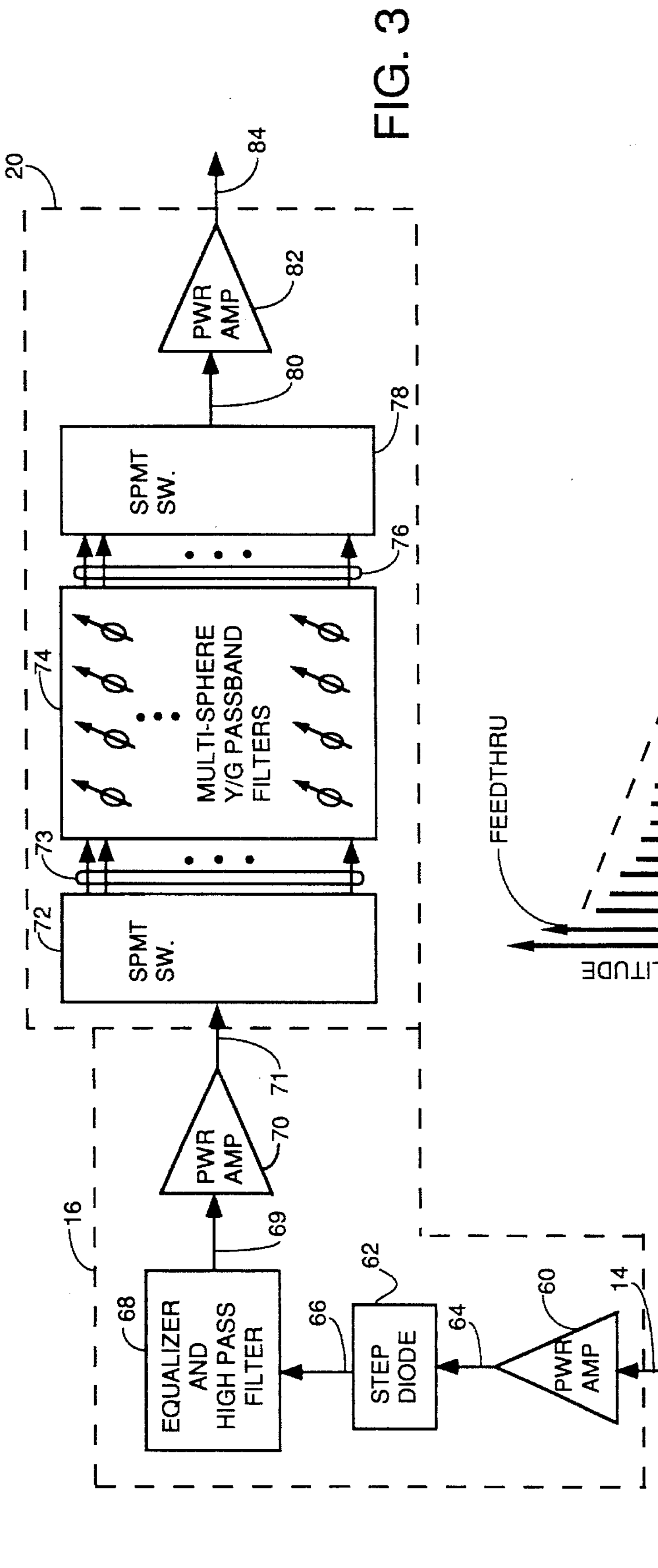
FIG. 3 shows the preferred embodiment of an input structure for the class of embodiments symbolized by FIG. 1.

In the preferred embodiment, the bandwidth of the YIG passband filters in the output switched array 30 or in any of the other embodiments described herein including the embodiments symbolized by FIGS. 2 and 3 is 250 MHz or less so as to encompass the entire upper or lower sideband after the mixing operation. The filter bandwidth of whatever type of filter follows the mixer 24 in FIG. 1 must be narrow enough however to exclude the fundamental frequency and the other sideband frequency.

The filtered output signal at the desired frequency is output on line 25 in FIG. 1.

Referring to FIG. 3 there is shown the preferred embodiment of an input structure for the class of embodiments symbolized by FIG. 1. In the embodiments symbolized by FIG. 3, elements having the same reference numerals as given for elements in FIG. 1, have the same function and purpose in the combination and everything that has been previously said about them remains true for the embodiments symbolized by FIG. 3.

A 500 MHz SAW oscillator 10 generates a fundamental frequency on line 14 which is input to a power amplifier 60. Any other fundamental frequency such as 250 MHz could also be selected at the cost of more YIG passband filters in multi-filter, fixed-tuned switched arrays. The power amplifier has sufficient gain to increase the power output of the SAW 10 to approximately +27 dbm. The power amplifier also provides isolation between the SAW output and the nonlinear input impedance of a step diode comb line generator 62.

The purpose of the step recovery diode assembly 62 is to receive the sine wave output from the power amplifier on line 64 and generate harmonics thereof on line 66. The step recovery diode assembly is conventional and generates harmonics which range in frequency from 5–10 GHz. An input network (not separately shown) matches the 500 MHz, 27 dBm input signal to the input impedance of the step recovery diode. The high signal level then drives the step recovery diode into its nonlinear region which causes the diode to produce a harmonic rich voltage spike at the output. The harmonic spectrum typically includes comb lines beyond 10 GHz also.

Figure 4:
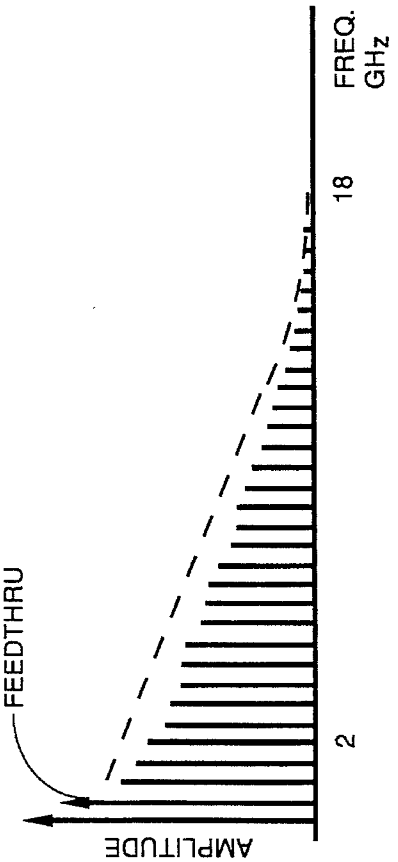
FIG. 4 shows a typical comb line spectrum which is output from a step diode when driven by a sine wave.

In the preferred embodiment where the desired range of output harmonics covers only about one octave in range, a reverse slope equalizer is not necessary. However, a reverse slope equalizer, like assembly 68 in FIG. 3 is used to level the power of the comb lines output from the step recovery diode 62 in embodiments where the desired output frequencies extend over more than an octave, e.g., a decade. FIG. 3 represents these embodiments. To understand why a reverse slope equalizer is desirable in some embodiments, the reader should refer to FIG. 4 which shows the typical output spectrum of the step diode assembly 62 and gives the relative amplitude of each comb line relative to its frequency. The first harmonic or comb line is shown at 67. Note that its amplitude and power level are greater than the amplitude and power level of the second comb line harmonic shown at 69 and substantially greater than the amplitude of the 28th harmonic 71. The higher power level of the low order harmonics will saturate any subsequent power amplifier even though the average comb line power level could be easily handled. This limits the applications to which the frequency synthesizer can be put by preventing the use of less expensive power amplifiers and possibly preventing the use of any subsequent power amplifier at all. To alleviate this problem, it is preferred to equalize the power levels of the comb lines thereby preventing saturation of subsequent power amplifier stages. This saturation occurs because the comb lines are nearly coherent frequencies.

To accomplish the reverse slope equalizing function, a conventional reverse slope equalizer available from Inmet Corporation is used. The reverse slope equalization device should have the approximate insertion loss versus frequency characteristics shown in FIG. 12. The vertical axis in the graph of FIG. 12 is insertion loss and the horizontal axis is frequency in GHz. The performance for the reverse slope equalizer shown in FIG. 12 is preferred for practicing these embodiments of the invention. Specifically, the reverse slope equalizer should have an insertion loss of approximately 20 dB at a frequency of approximately 2 GHz and an insertion loss of 1.5 dB at a frequency of approximately 18 GHz. The return loss over the entire range should be approximately 20 db. Any reverse slope equalizer that at least approximately meets these criteria will suffice for practicing these embodiments of the invention.

FIG. 13 shows the composite comb line spectrum on line 69 after the equalization of the amplitudes of the comb lines by the reverse slope equalizer. In FIG. 13, the vertical axis is the power in the comb line spectrum in db, and the horizontal axis is the frequency in GHz. Performance characteristic 71 represents actual measurements of comb line power taken in the range from 2 to 18 GHz. There is a variation of approximately 6 dB between the peak power comb line at approximately 12 GHz and the comb line at 18 GHz in the performance curve 71. If the performance curve 71 were to be extended to 26 GHz, it is thought that the maximum variation in comb line power would be approximately 26 db. The performance characteristic shown by curve 73 is optimized for performance from 2–26 GHz. The maximum variation in comb line power for the performance curve 73 is approximately 9 dB for the range from 2–26 GHz. The comb line powers of –9 dB at point 75 and –26 dB at point 79 represent feedthrough of the fundamental frequency at 1 GHz from the SAW oscillator. Note that the concept of negative slope equalization is broadly applicable regardless of the fundamental frequency of the SAW oscillator, but FIG. 13 represents actual data taken for a 1 GHz SAW frequency.

The use of reverse slope equalizer 68 provides non-reactive input impedance to the step diodes of the comb line generator 62 thereby reducing the impedance mismatch problems and the possibility of parasitic oscillation. The reverse slope equalizer also narrows the amplitude window thereby alleviating the limit problems of putting RF gain in front of the YIG filter arrays that limited the versatility of prior art YIG-tuned harmonic generators. The amplitude shaping of the output spectrum from the reverse slope equalizer and any nonlinear phase performance which disperses comb line energy also lowers the peak power of the output waveform thereby minimizing the limit problem of any RF amplifier following the reverse slope equalizer or YIG filter arrays. This allows solid state RF amplifiers to be used which saturate at the same peak and average power level either before the YIG filter, or, in some embodiments, without the YIG filters. Further, much higher output power levels can be achieved by use of the reverse slope equalizer because RF amplifications can be used and the amplifier can be placed in front of the YIG filter arrays so any harmonics or noise can be filtered out by the YIG passband filter which is selected. The higher power levels available because of the amplification before the YIG filter arrays, allows more versatility. For example, the Ferretrac® closed loop tracking system available from Ferretec, Inc. of Fremont, Calif. (incorporated by reference herein) can be used with the comb line generator to stabilize the system, and the required dynamic range for any leveling loop incorporated at the output of the YIG filter arrays can be less.

Further, use of the reverse slope equalizer allows the YIG sphere size and gauss level to be optimized over the full frequency range rather than being forced into a situation of optimizing for the lower comb line frequencies at the expense of performance at the higher harmonics as was the situation in the prior art. It also minimizes the tuning problems caused by pulling of the first YIG sphere passband center frequency by the output impedance of the step diodes.

Any device that can receive the comb line spectrum and narrow the amplitude window within which the power levels of the comb lines lie and which can provide a better impedance match between the comb line generator and whatever device follows it thereby allowing an RF amplifier to be used following the comb line generator without saturation or limit problems at the lower comb line frequencies will suffice for purposes of practicing the invention.

Returning to the consideration of FIG. 3, the equalizer assembly also includes a high pass filter to eliminate the higher power comb lines below approximately 5 GHz in the preferred embodiment. By eliminating the high power comb lines at the low end of the spectrum below approximately 5 GHz and by approximately equalizing the amplitudes of the comb lines, there is enabled use of a power amplifier 70 following the equalizer to provide additional gain without saturating. The power amplifier 70 has a bandwidth of 5–10 GHz and increases the comb line power to approximately 0 dbm. Since the output waveform of the step recovery diode is a voltage spike, adding too much gain will clip this voltage spike at the output of the amplifier and distort the output comb line spectrum. Maximizing the gain prior to the YIG filter array 74 is advantageous because the narrow bandwidth filters in the YIG filter array 74 reduce the noise power of the signal.

The output of the power amplifier 70 is coupled to the input of a single-pole, multi-throw switch 72. This switch is used to direct the comb line spectrum signal on line 71 onto one of the plurality of input lines 73 coupled to the inputs of the multiple YIG passband filters in the YIG filter array 74. In the preferred embodiment, there are 11 permanent magnet-biased, fixed-tuned, YIG passband filters in the array 74. Preferably, the switch 72 is implemented using gallium arsenide field effect transistors because these devices use very low current. However, in alternative embodiments, other switching arrangements can be used depending upon the switching speed requirements. Gallium arsenide field effect switches with relatively low loss up to 10 GHz which can be switched in less than 10 nanoseconds are commercially available.

In the preferred embodiment, the YIG filter array 74 is comprised of 11 separate, 4 stage (4 YIG spheres per filter), permanent magnet biased YIG passband filters. This array, in combination with switch 72, selects the appropriate comb line by filtering out all the other comb lines except the one that lies within the passband of the YIG filter whose input line is selected by switch 72. Unwanted comb lines are rejected by 80 db. The YIG spheres in the filters are undoped and have a bandwidth of 40–50 MHz. The YIG material, number of stages and bandwidth are chosen to minimize the insertion loss, to assure that the filter passband includes the comb line frequency to be selected and to provide sufficient rejection for the unwanted comb lines.

The output of the YIG filter array is a plurality of lines shown at 76. These lines are coupled to the inputs of a second single-pole, multi-throw switch 78 of the same construction as switch 72. The switch 78 takes the selected comb line signal on one of the lines 76 and couples it to line 80. The signal on line 80 is a CW (continuous wave) signal, and is coupled to the input of a 5–10 GHz amplifier 82. Since one channel of the filter array 74 is tuned to each comb line, the isolation of the combination of the two switches 72 and 78 must be sufficient to reject the unwanted comb lines. The amplifier 82 can use conventional limiting levels since only one continuous wave signal is present at its input. The amplifier 82 should boost the signal level to approximately +10 dbm. The output line 22 of this amplifier is used to drive the mixer 24 of FIG. 1.

Figure 5:
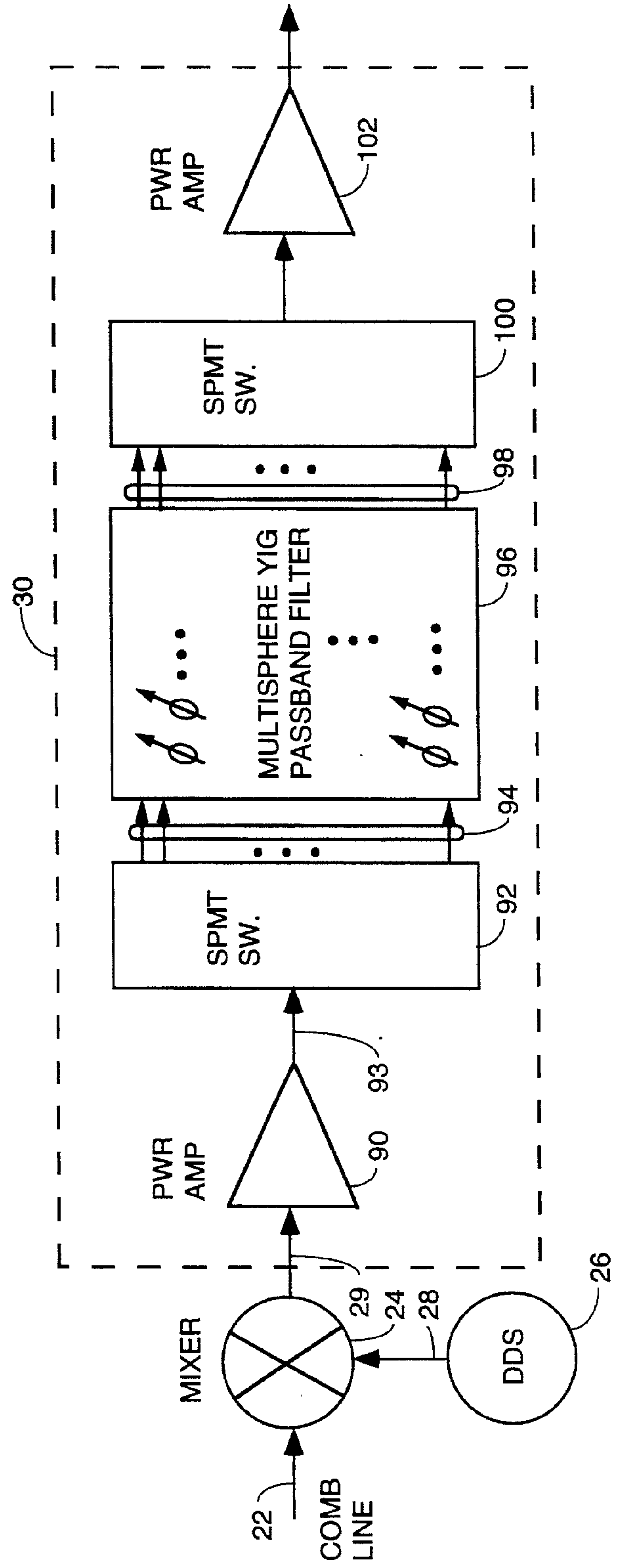
FIG. 5 shows a block diagram of an output assembly for the preferred embodiment of a frequency synthesizer shown in FIG. 1.

Referring to FIG. 5, there is shown a block diagram of the preferred embodiment of an output assembly for the frequency synthesizer of FIG. 1. The purpose of this output assembly is to receive the selected, amplitude modified comb line from the input module of FIG. 3, and translate the frequency thereof by mixing the comb line with a local oscillator signal from a direct digital synthesizer.

The direct digital synthesizer local oscillator is symbolized by circle 26. Several manufacturers offer direct digital synthesizers, and typical output frequencies of up to about 400 or 500 MHz are available. Although, in the preferred embodiment, the DDS 26 will be small and have very fast switching speeds, larger and/or slower DDS devices can also be used for local oscillator 26 within the teachings of the invention. The advantage of using a DDS for the local oscillator is that the phase noise and spurious level of the DDS is directly translated to the microwave output signal since no multiplication of this signal is required. This means that the output signal generated by the invention will have lower phase noise and spurious levels than prior art frequency synthesizers that use frequency multiplication to do the frequency translation.

The frequency resolution of the DDS 26 at this output frequency is less than 0.5 Hz, and the switching speed is less than 100 nanoseconds. The phase noise of the DDS 26 is preferably −90 dbc/Hz at 100 KHz. Spurious outputs are typically less than −60 dbc, and each of these characteristics will be inherited by the microwave output signal.

DDS oscillators are typically available with phase modulation. Therefore, in the invention, since the DDS output is directly translated to the microwave output signal, the DDS oscillator 26 can be used directly to provide phase modulation of the output signal.

The mixer 24 combines the selected comb line on line 22 from the input assembly shown in FIG. 3 with the 250 to 500 MHz DDS signal on line 28. The mixer can be any conventional device used in microwave superhetrodyne receivers, and produces both upper and lower sidebands of the DDS signal around the selected comb line frequency as the "carrier". The mixer also provides about 20 dB of isolation of the comb line thereby reducing feedthrough of the comb line frequency from line 22 to line 29.

The comb line "carrier" and its sidebands on line 9 are applied to the input of a 5 to 10 GHz amplifier 90. This amplifier boosts the continuous wave mixer output signal plus its sidebands between 0 and +5 dbm.

A single-pole, multi-throw switch 92 receives the amplified comb line carrier signal and its sidebands on line 93 and guides these signals onto one of the multiple input lines 94 of the multi-sphere YIG passband filter 96. The signal on line 93 is comprised of a desired sideband of the mixing process, and undesired sideband and a comb line feedthrough signal. The switch 92 is operated so as to direct the signal on line 93 to the appropriate one of the lines 94 which are coupled to the passband filter in array 96 which encompasses the desired sideband signal.

A 20-channel, 7-stage, permanent-magnet-biased, YIG passband filter array 96 has a plurality of signal inputs, one for each passband filter therein. Each of these inputs is coupled to one of the lines 94. Each passband filter is permanent magnet biased to have a center frequency that corresponds to the desired sideband of one of the comb lines and has a bandwidth which is sufficient to encompass any desired sideband signal should the comb line corresponding to the center frequency be selected. Each of the 20 channels has a bandwidth of approximately 300 MHz, and covers 250 MHz of the band between 5 and 10 GHz. A 7-stage filter is chosen to provide the approximately 50 dB of rejection of the comb line feedthrough signal which is separated from the center frequency of the filter by approximately 375 MHz. An additional 20 dB of rejection is provided by the mixer. The selected passband filter also provides 80 dB rejection of the unwanted sideband which is separated by between 625 and 875 MHz from the center frequency of the filter.

Filters designed with 300 MHz bandwidth at these frequencies use either LiFe or NiZn material for their resonators depending upon their frequency of operation.

The signal outputs of the YIG passband filters in array 96 are coupled to a plurality of output lines 98 which are coupled to a single-pole, multi-throw switch 100. This switch selects the appropriate output signal line from the array 96, and couples it to the input of a power amplifier 102. As in the case for switches 72 and 78 in the input assembly of FIG. 3, the combination of switches 92 and 100 provides a minimum of 80 dB isolation to reject the unwanted signals that fall in the passband of another filter in the array.

A final power amplifier 102 receives the output signal from the switch 100 and amplifies the signal to the desired level of a minimum of +10 dbm.

Figure 6:
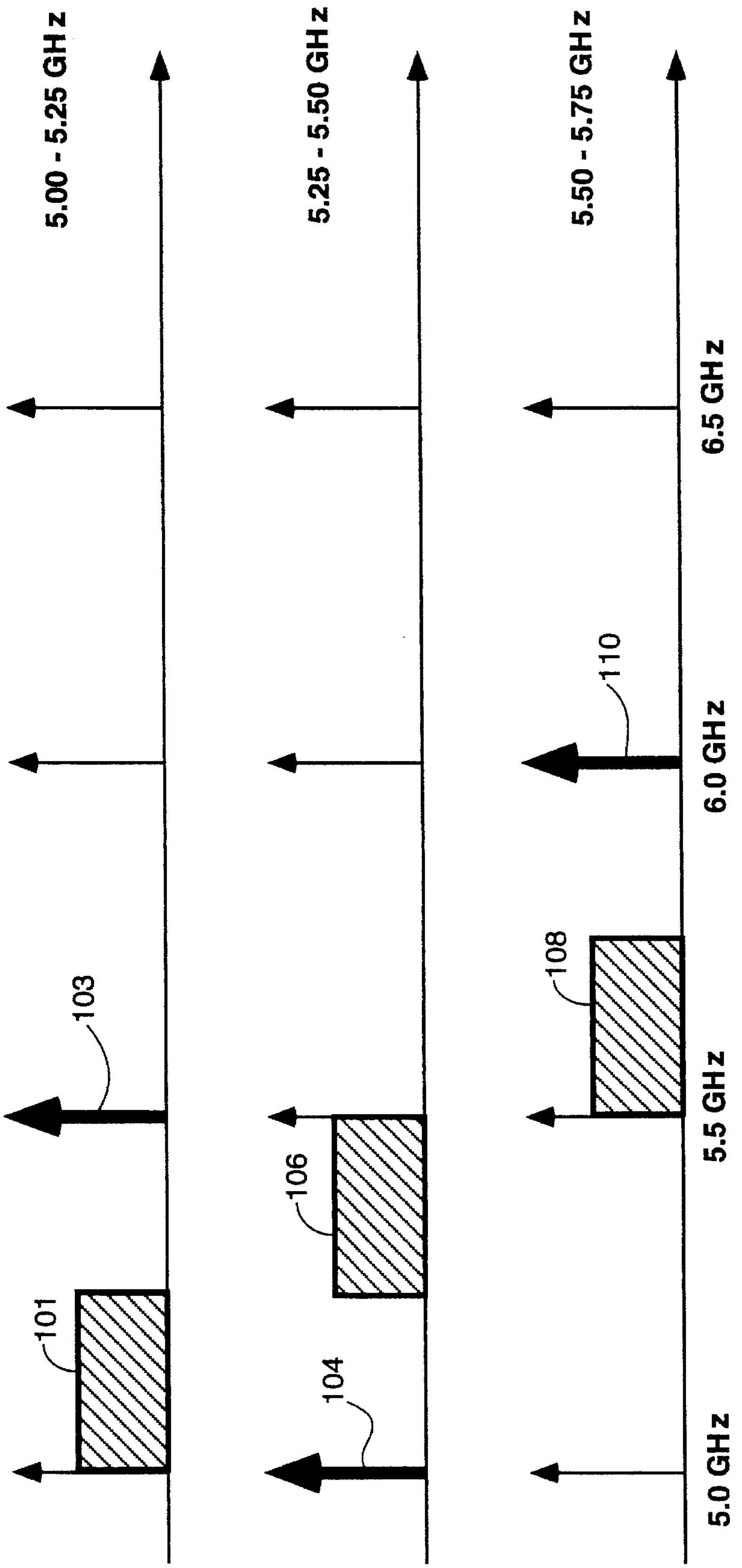
FIG. 6 shows a frequency plan for the frequency synthesizer of FIG. 1.

Referring to FIG. 6, there is shown a diagram of a frequency plan for the frequency synthesizer of FIG. 1. To produce an output signal in the 5.000 to 5.250 GHz frequency as shown at 101 in FIG. 6, the input filter array 20 in FIG. 1 selects the 5.5 GHz comb line 103. This comb line 103 is mixed with the DDS local oscillator signal and the output filter array 30 selects the lower sideband to output.

If the desired output signal is 5.100 GHz, the DDS is set to 400 MHz. This 400 MHz DDS signal is mixed with the 5.500 GHz comb line 102 which produces an upper sideband at 5.9 GHz and a lower sideband of 5.1 GHz. The output YIG filter array 30 selects the 250 MHz bandwidth filter centered at 5.25 GHz which passes the 5.100 GHz signal and rejects the 5.900 GHz signal as well as the 5.5 GHz comb line signal.

For output signals between 5.25 and 5.5 GHz, the input filter array 20 selects the 5.000 GHz comb line 104 and the output filter array 30 selects the filter with the 5.25 to 5.50 GHz passband symbolized by the block of output frequencies shown at 106. This process continues throughout the 5–10 GHz band as symbolized by the output signals between 5.5 and 5.75 GHz shown at 108 by selection of the 6.0 GHz comb line 110 by the input filter array and selection by the output filter array of a passband filter with a passband encompassing 5.5 to 5.75 GHz.

For generation of output signals at the upper end of the 5–10 GHz band, the input array 20 selects the 9.5 GHz comb line which is mixed with the DDS signal with the output array 30 set to select the upper sideband to cover the 9.75 to 10.0 GHz range.

The permanent magnet biased YIG filters used in the preferred embodiments of the input and output filter arrays 20 and 30 are an important factor in providing high Q filters with stable resonant frequencies. Historically, YIG filters have been known to offer the highest unloaded quality factor, Q, and the most stable resonant frequency available at microwave frequencies. YIG filters offer this performance in an extremely small volume, generally 0.010 inch diameter spheres. The problem in the prior art in trying to make small frequency synthesizers has been in the size and power consumption of the magnets necessary to provide a tuning bias. According to the teachings of the invention, ultrastable, high energy permanent magnet material is used to provide tuning bias magnetic field for each YIG passband filter. In the preferred embodiment, Samarium Cobalt is used for the permanent magnet tuning bias structure. This means a tuning bias structure can be built for each passband filter which uses no power and which is very compact and which can generate and maintain the necessary magnetic field for tuning the center frequency of the YIG spheres. The magnetic fields produced are extremely stable with changes in either temperature or time, and can be produced in an extremely small volume.

The YIG filter arrays are designed using a known computer model based upon coupling coefficients as is well known in the art. Based upon the model, the coupling coefficients are then measured and set during the manufacturing process. This process of modelling and setting the individual coupling bandwidth of each filter within the filter results in a very reproducible, controlled filter performance.

Many manufacturers offer direct digital synthesizers with output frequencies up to 400 MHz and higher operating frequency units will soon be available. The exact operating frequency of the DDS is not critical to the invention. However, since the direct digital synthesizer local oscillator is used to fill in the frequencies between the comb lines, the operating frequency of the DDS determines the number of comb lines needed to cover the desired band. The number of comb lines dictates the number of YIG passband filters needed in the input and output arrays.

The performance of the DDS is compatible with the performance requirements of modern microwave synthesizers. Spurious specifications of –60 dbC are typical, as are phase noise specifications of –90 dbC/Hz at 100 KHz. Since the DDS output frequencies are translated directly to the desired microwave band without any multiplication, the DDS performance parameters are reflected directly in the output signal characteristics without degradation.

Use of low power MMIC GaAsFET switches for the switching functions shown at 72, 78, 92 and 100 in FIGS. 3 and 5 makes it possible to make a miniature switched YIG filter array practical. MMIC versions of these switches are now available with integral drivers that draw less than 30 milliamps at 12 volts bias even with nanosecond switching times.

The power amplifiers 60, 70, 82, 90 and 102 in FIGS. 3 and 5 are broadband MMIC GaAsFET amplifiers which provide gain across a broad band of microwave frequencies. A one micron linewidth technology required to operate up to 10 GHz is low cost and easily manufactured.

The use of low phase noise SAW oscillators provides the best phase noise performance source in the 500 MHz range. These SAW oscillators can be phase locked to an external crystal reference. The phase noise of this combination is low enough that even when multiplied up to microwave frequencies, the resultant phase noise is less than –90 dbC/Hz at 100 KHz. Thus, the SAW oscillator is the preferred source.

The use of permanent magnet tuning bias to set the filter center frequency according to the teachings of the invention overcomes the filter passband frequency errors of the prior art YIG-tuned harmonic generators. The permanent magnets are extremely stable and no hysteresis occurs, because each filter is fixed-tuned and no drivers are required. The lack of drivers eliminates the source of frequency error associated with aging thereof. In addition, with a minimum frequency of 5 GHz, the problems of bandwidth limiting caused by the need to use gallium doped YIG material for the spheres for frequencies below 2 GHz are eliminated. Further, because the SAW frequency input is 500 MHz, the bandwidth of each YIG passband filter can be set as wide as necessary to ease product manufacturing and increase reliability without the fear of frequency drift because the comb lines are spread much further apart. Therefore, a reliable filter bandwidth can be selected, without fear of an inability to filter out adjacent comb lines.

Further, the impedance matching problems between the SRD and the YIG filter found in the YIG-tuned harmonic generator prior art is eliminated in the invention by insertion of a matched reverse slope equalizer 68 in FIG. 3 between the SRD harmonic generator 62 and the input of the first YIG filter array 20 in embodiments where a broad range of output frequencies must be generated. In other embodiments, an 6 db pad or attenuation device is used for this purpose. The reverse slope equalizer decreases the output power of the harmonic generator at the lowest frequency comb lines and greatly reduces the "uncontrolled" impedance/mismatch problem. The decreased power in the desired output frequency range is overcome with additional RF gain at the output of the harmonic generator.

The time to tune the frequency synthesizer according to the teachings of the invention from one frequency in the range to any other frequency in the range is limited only by the time it takes the FET switches to select the proper comb line in the input assembly, and the time it takes to tune the DDS to tune to a new frequency. Both of these switching times are well under 100 nanoseconds which provides an order of magnitude improvement in switching times over the prior art. Use of fixed tuned filters makes this possible. In addition, the use of YIG fixed tuned filters allows the entire system to be encapsulated in a small package which is substantially smaller and less expensive than competing technologies such as those manufactured by Hewlett Packard.

Power consumption of the frequency synthesizer according to the invention is kept low by use of the permanent magnet tuning bias structures which require no D.C. source. The GaAsFET switches also require very little power. The DDS and SAW oscillator require nominal D.C. bias currents. The largest power consumers in the structure are the four power amplifiers.

The cost of the synthesizer of the invention depends in part upon the DDS selected. The system will be more expensive if the maximum frequency needed from the DDS is 500 MHz as opposed to some lower frequency. Of course, a lower DDS maximum frequency will require that more YIG passband filters be used. For example, small, fast DDS devices are currently available with maximum frequencies up to 250 MHz.

The combination of the aforementioned elements provides an extremely low noise, fast switching, synthesized microwave signal of a variable frequency between 5 and 10 GHz with 0.5 GHz frequency resolution and 10 dBm output power. Maximum switching speed is 1 microsecond, and phase noise is –90 dbc/Hz at 100 KHz maximum. Spurious outputs are –60 dbC, maximum and harmonic output is –20 dbC maximum. Typically, this package can be provided in a space of 120 cubic inches or less.

Figure 7:
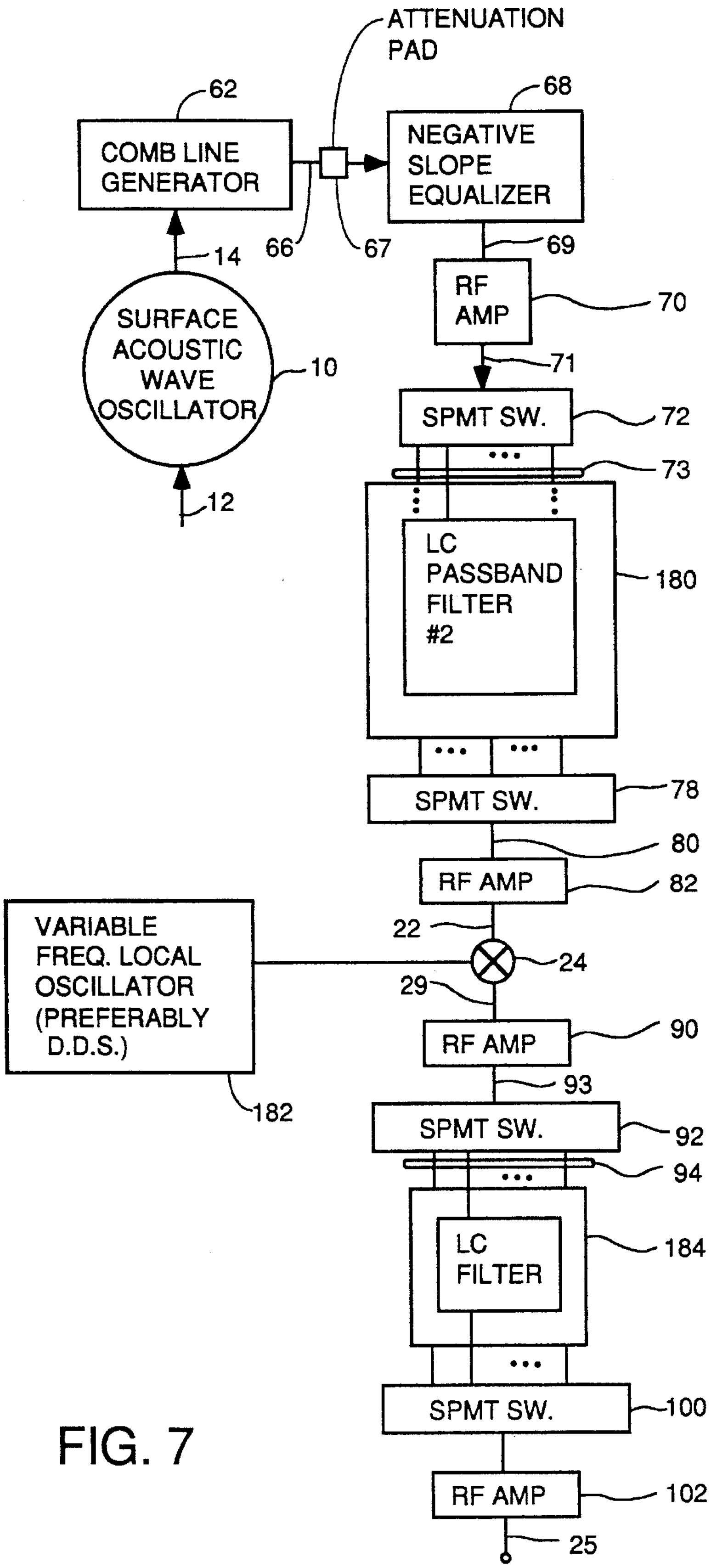
FIG. 7 is a block diagram of a frequency synthesizer similar to the synthesizer shown in FIG. 1 except that two arrays of switched LC passband filters are substituted for the fixed-tuned YIG passband filter arrays.

Referring to FIG. 7, there is shown a synthesizer similar to the synthesizer described in FIGS. 1, 3 and 5 except that two switched arrays of LC (inductor-capacitor tuned circuit) passband filters are substituted for the switched arrays of YIG passband filters. Elements having like reference numbers to elements found in FIGS. 1, 3 and 5 serve the same purpose, have the same structure and interact with the other elements in the same way as like numbered elements previously described. An array of LC passband filters 180 is substituted for the switched array of YIG passband filters 20 in FIG. 1. It serves to select a single comb line in the signal from the output of the comb line generator for mixing in the mixer 24 with the signal from the local oscillator. The design of such LC filters for use in the microwave band of interest from 5–10 GHz is well known in the art. In embodiments where a range of output signal frequencies which span more than an octave are to be generated, a reverse slope equalizer 68 can be used, but such a device is not necessary for output frequencies from 5–10 GHz.

ADDS local oscillator 182 generates the signal to be mixed with the comb line to translate the comb line to the desired frequency. The local oscillator 182 has to be variable in frequency and be able to span a range of frequencies equal to the distance in frequency space between the comb line frequencies.

A switched array of fixed-tuned, LC filters 184 is substituted for the switched array of fixed-tuned YIG passband filters 30 in FIG. 1. This array is similar in structure to the array 180 and serves to select the desired sideband from the mixing operation in the output signal on line 93 from the RF amplifier 90.

In alternative embodiments, one or more of the RF amplifiers 70, 82, 90, or 102 may be eliminated.

Another alternative embodiment is disclosed in FIG. 8. In this embodiment, two tunable YIG filters are substituted for the switched arrays of fixed-tuned YIG filter arrays 20 and 30 in FIG. 1. Elements having like reference numbers to elements found in FIGS. 1, 3 and 5 serve the same purpose, have the same structure and interact with the other elements in the same way as like numbered elements previously described. The tunable YIG filter 21 and its tuner 190 combine to select a single harmonic from the spectrum at the output of the RF amplifier 70 on output line 71. The tuner generates a DC tuning bias signal on line 192 that controls the intensity of a magnetic field inside YIG filter 21 to tune the center frequency to encompass the selected comb line.

Likewise, the tunable YIG filter 194 and its tuner 196 are tuned to select a desired sideband from the output of the mixer 24 on line 29 and to filter out the comb line and the other sideband from the output signal on line 25.

The local oscillator 26 is a direct digital synthesizer. In some embodiments where the range of desired output frequencies is small, e.g., an octave, the reverse slope equalizer 68 and/or the RF amplifier 70 may be eliminated.

In all the embodiments disclosed herein where reverse slope equalizers are used, they may be 20 or 30 dB units from Inmet Corp., and the comb line generators may be 500 MHz units from Herotek Inc. and the broadband RF amplifiers may be 2–20 GHz units with 12 dB gain available from Avantek, Inc. The addition of an RF amplifier to the output of the negative slope equalizer increases the comb output power approximately 9 dB across the entire comb spectrum.

Figure 9:
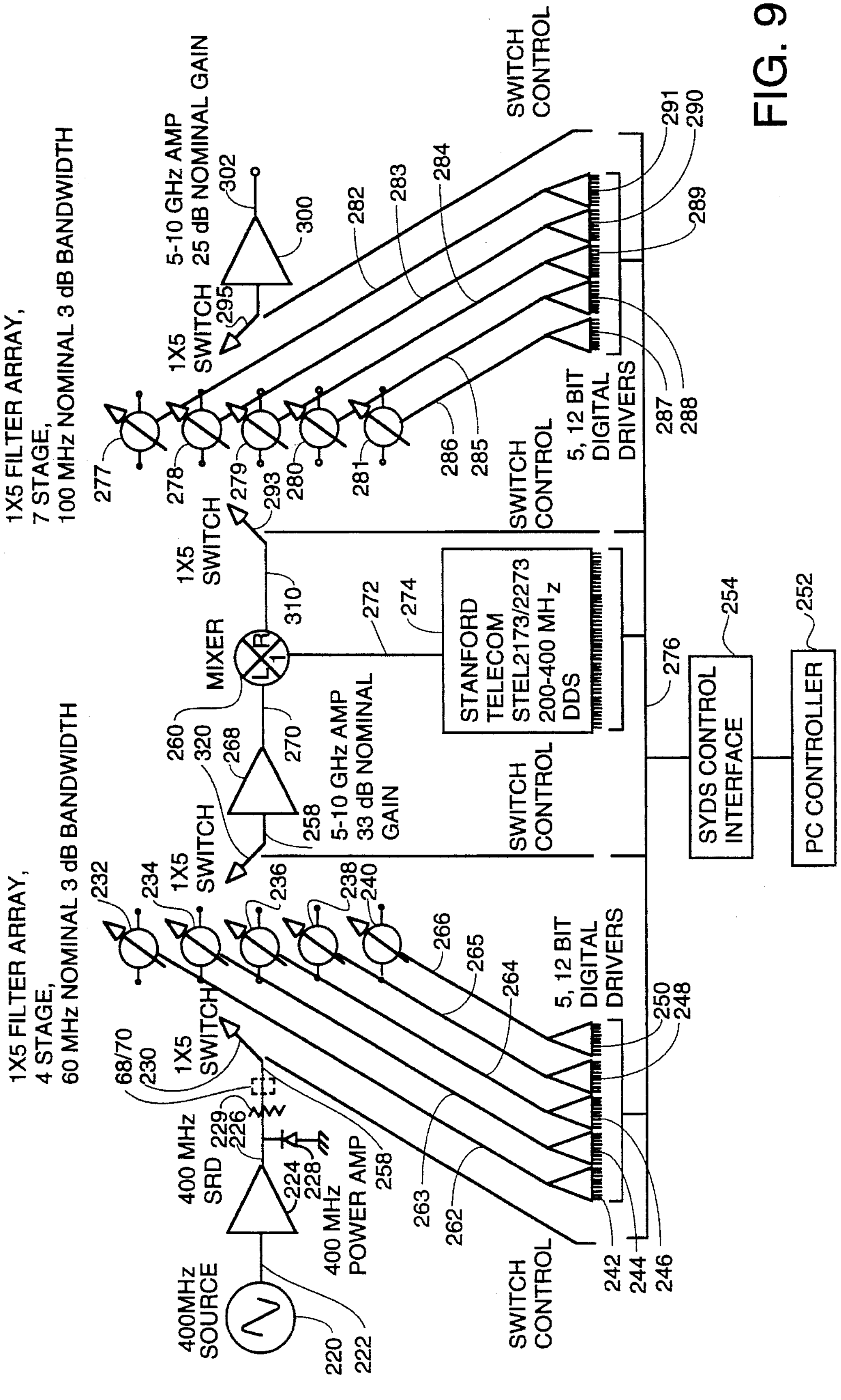
FIG. 9 is a block diagram of an alternative embodiment using a DDS local oscillator and an array of 5 tunable bandpass YIG filters to select the desired harmonic and an array of 5 tunable bandpass YIG filters at the output to select the desired sideband to generate the output signal.

Referring to FIG. 9, there is disclosed another embodiment of a microwave synthesizer using a DDS synthesizer and two switched arrays of 5 tunable YIG filters at the input and output. A 400 MHz fixed frequency oscillator 220 generates the fundamental frequency on line 222 which will be used to generate the comb line spectrum. This source is an HP 8644B synthesizer although synthesizers with 10–20 dB better phase noise are available. This signal is amplified by an amplifier 224 and fed on line 226 to a step recovery diode 228 which provides the nonlinearity necessary to generate the comb line harmonics spaced at 400 MHz intervals.

The comb line harmonics are fed through an attenuation device 229 (for impedance matching) to the input of a 1-input, 5-output multiplexer 230 which has each of its five outputs coupled to a different tunable YIG passband filter which are shown at 232, 234, 36, 238 and 240. In the preferred embodiment, the multiplexer 230 and the other multiplexers 320, 293 and 295 are broadband PIN-diode switches. The YIG filters 232 through 240 have their outputs coupled to the five inputs of a 5-input, 1-output multiplexer 320. In some alternative embodiments, a reverse slope equalizer, symbolized by box 68/70 in dashed lines, can be inserted between the step recovery diode 228 and the input filter array multiplexer 230 or, preferably, can be substituted for the attenuation device, to level the power in the various harmonics to approximately equal levels. Preferably, the reverse slope equalizer will be coupled to an amplifier, also symbolized by dashed line box 68/70 to amplify the harmonic spectrum before the comb lines are applied to the input filter array.

Each YIG filter is a four-stage, 60 MHz nominal 3 dB bandwidth passband filter which has a frequency control input for receiving a tuning signal which can alter the center frequency of the filter passband. These tuning signals are generated by five 12 bit digital drivers 242, 244, 246, 248 and 250 under the control of a computer 252 and an interface 254. This interface is a programmable gate array in the preferred embodiment to achieve the fast transition and data transfer times needed to achieve the desired switching speed. The computer 252 is typically a personal computer and is used to load any stationary data needed by the programmable gate array (PGA) 254 while the PGA is used to provide the dynamic data that controls the multiplexers, the DDS and the tuning signal drivers for the YIG filter arrays.

Typically, the YIG filters 232 through 240 are each tuned to a different harmonic of interest and the computer 252 then jumps rapidly between harmonics to feed to a mixer 260 by controlling the multiplexers 230 and 320 to rapidly switch different YIG filters into the signal path 258 coupling the step recovery diode 228 to the mixer 260. The computer 252 can also control the center frequency of each YIG passband filter 232 through 240 by addressing the 12 bit digital drivers individually and writing data to them for conversion to analog tuning signals on lines 262 through 266.

An amplifier 268 boosts the power of the output signal from the selected YIG filter. Typically, this amplifier has a bandwidth of 5–10 GHz and 33 dB of gain.

The mixer 260 mixes the amplified comb line frequency on line 270 with a variable frequency local oscillator signal on line 272 from a DDS 274 with a range of output frequencies from 200–400 MHz. The DDS acts as a divider of a 1024 MHz clock (not shown). Since the DDS is up-converted and never multiplied, its phase noise performance is preserved in the output signal. In the preferred embodiment, the DDS 274 is manufactured by Stanford Telecom as model STEL 2173/2273. The computer 252 writes data to the DDS 274 via data bus 276 to control the frequency output by the DDS on line 272.

The output signal from the mixer 260 on line 310 is filtered by an array of 5 tunable YIG passband filters 277, 278, 279, 280 and 281 under the control of tuning signals generated on lines 282–286 by five 12-bit digital drivers 287, 288, 289, 290 and 291 under the control of computer 252 and the programmable gate array (PGA) interface 254. The stability of the frequency tuning drivers 242–250 for the input array and the frequency tuning drivers 287–291 is important and should be such as to not substantially contribute to the overall phase noise by perturbing the center frequency of the selected filters so as to phase modulate the output signal.

The computer 252/PGA 254 (hereafter referred to sometimes simply as the computer 252) also controls selection of one of the YIG passband filters by simultaneously controlling the switching state of 1-to-5 multiplexer 293 and 5-to-1 multiplexer 295. These multiplexers and YIG filters are controlled by the computer to have passbands which have center frequencies centered on the upper or lower sideband of the selected comb line passed to the mixer by the selected one of the input array YIG filters 232 through 240. The output YIG filters are typically 7-stage, 100 MHz nominal 3 dB bandwidth passband filters.

Output signals anywhere in the range from 5–10 GHz can be achieved with the embodiment shown in FIG. 9.

The advantage of using a DDS is that very fine frequency resolution, phase continuous frequency changes, fast switching between frequencies and the ability to perform complex phase and frequency modulation schemes is achieved.

Typically, the computer 252 tunes the five input YIG filters 232–240 to pass five different comb lines and tunes the DDS 274 rapidly to different local oscillator mixer frequencies to be mixed with the different comb line signals on line 270. Simultaneously, the computer tunes the output YIG filters 277–281 to have passbands centered on the appropriate sidebands containing the desired signals for each of the five comb lines tuned by the five input filters. Because of the 100 MHz bandwidth and the pre-tuned center frequencies of each of the five output filters 277–281, and the pre-tuned center frequencies of the five input filters 232–240, the computer 252 is free to rapidly switch the frequency of the output signal on line 302 very rapidly, i.e., within about 100 nanoseconds. This tuning has a coarse and a fine component. Coarse tuning is done by controlling the multiplexer switches 230, 320, 293 and 295 to rapidly select different ones of the input and output filters to switch into the circuit. Obviously, the use of more filters allows rapid switching within 100 nanoseconds between more frequencies. The ultimate extension of the inventive concept is to use one fixed tuned filter for each comb line. The minimalist approach is to use only two tunable filters in a ping-pong arrangement such that while one is in use, the other is being tuned to the next desired frequency. With the embodiment shown in FIG. 9, any frequency in the designed output range can be synthesized within 100 nanoseconds.

Figure 10:
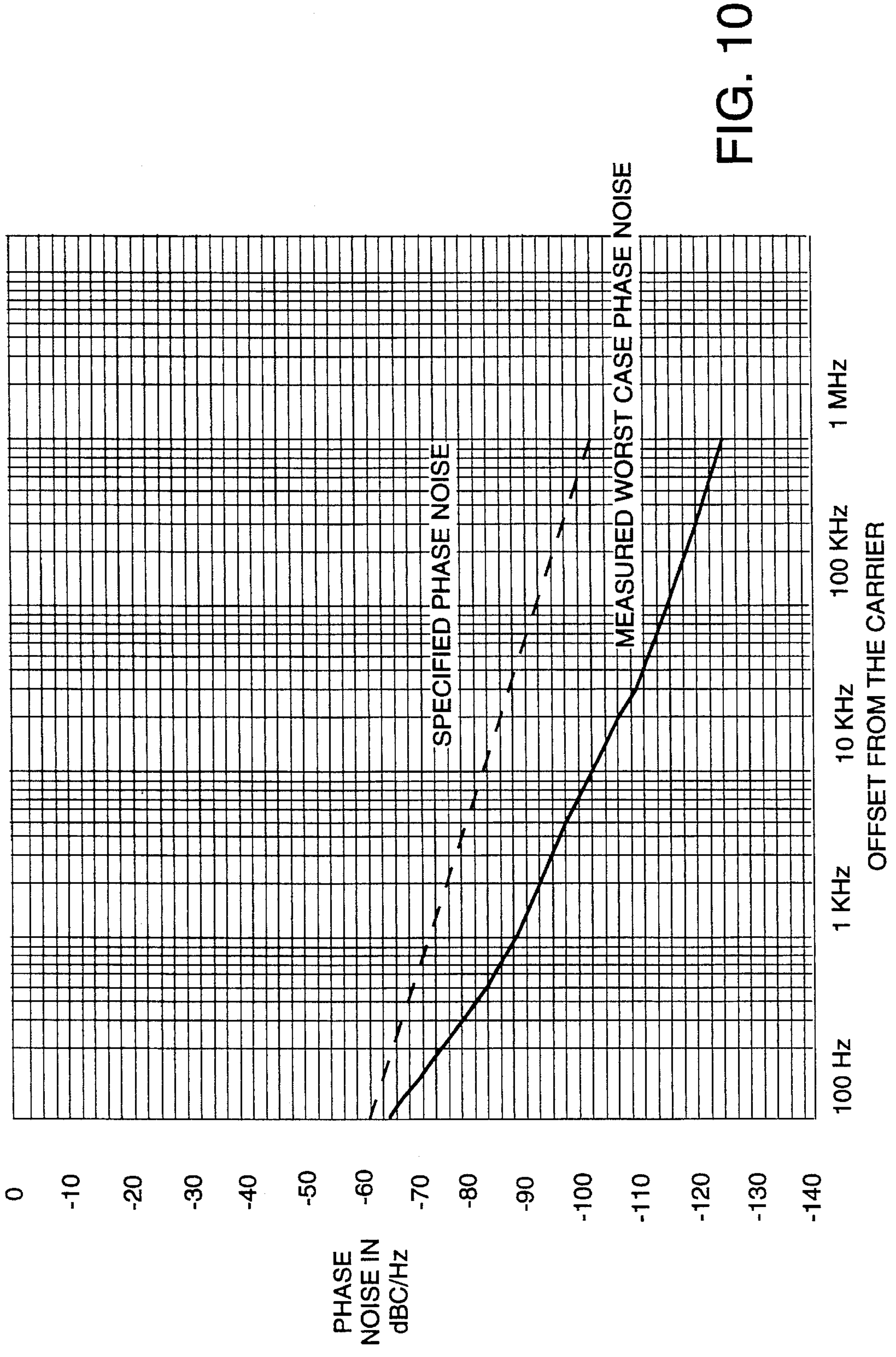
FIG. 10 is a plot of the phase noise achieved by the embodiment shown in FIG. 9.
Figure 11:
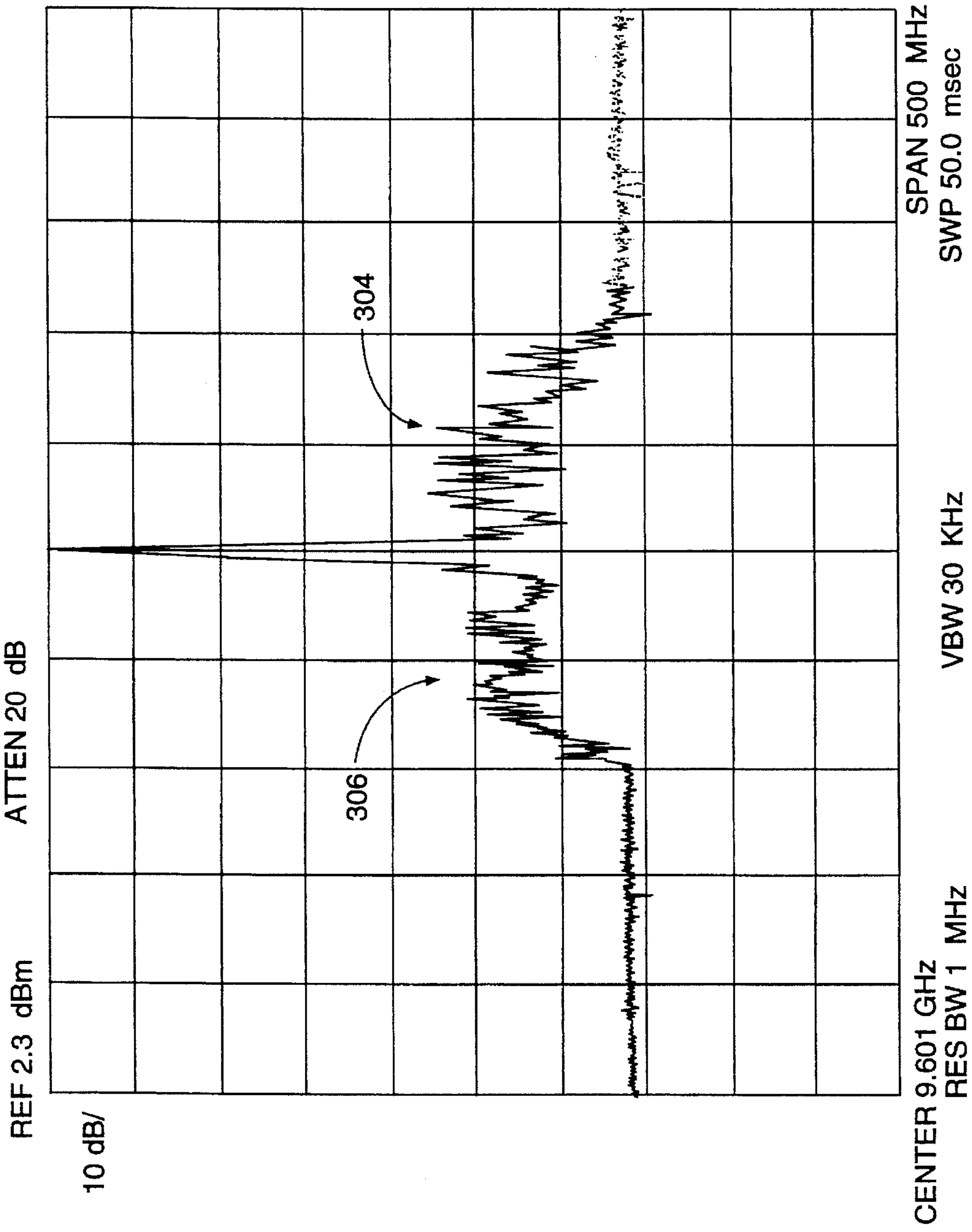
FIG. 11 is a plot of the output signal spectrum of the embodiment shown in FIG. 9 for currently available DDS units.

Fine tuning is accomplished by writing of tuning data to the DDS so as to rapidly alter its frequency such that the desired signal in the sideband to which the selected output YIG filter is tuned is altered plus or minus 50 MHz on either side of the center frequency of the selected YIG output filter. This allows chirping or hopping frequency alteration schemes. If a 200 MHz bandwidth output filter were used, the DDS output frequency could be altered throughout its entire 200–400 MHz range. Because the DDS and the multiplexer switches can be switched within a few nanoseconds, the principal component of the 100 nanosecond delay between changes from one DDS step frequency to the next is in the group delay through the filters but the multiplexer switching speeds, and the DDS switching speed are also factors. Using broader bandwidth YIG filters would decrease the propagation delay at the expense of less selectivity, i.e., suppression of spurious signals such as other comb lines, and worse phase noise. FIG. 10 shows a plot of the phase noise achieved by the design of FIG. 9 as specified herein. The limiting factor for the DDS spurious signal performance is the linearity of the digital-to-analog converter (DAC) within the DDS. Current generation DDS local oscillator use 8-bit DAC's, which theoretically yield 48 dBC spurious performance, but 12 bit DAC's are coming in future generations which should yield better spurious performance at 400 MHz. FIG. 11 shows one example of the output signal spectrum which is achieved at the output 302 of the embodiment shown in FIG. 9. The spurious signals shown generally at 304 and 306 at the base of the desired output frequency are caused by the nonlinearity of current DDS DAC's. As these designs improve, substantially better than 45 dB attenuation of spurious signals should be achievable within the teaching of the invention. The data shown at FIG. 11 was taken at 9.601 GHZ, the highest harmonic frequency with a DDS frequency of 399 MHz and therefore represents the worst case performance for phase noise performance.

A typical application of the embodiment of FIG. 9 for frequency hopping is to select and hold each comb line for 1.6 microseconds followed by a transition time of 120 nanoseconds before hopping to the next frequency. The transition time is the time needed select a new comb line by writing data to the multiplexers, change the DDS frequency and settle the output filters. The output is turned off during this 120 nanoseconds.

Typically chirp mode performance would generate 100 MHz chirps in 10 microseconds with 1 MHz resolution.

Fast sweep or scan mode requires the output filters to be tuned contiguously over a 500 MHz bandwidth and requires the input filters to be pre-positioned at the proper comb line frequency to provide continuous coverage of the desired frequency range. Essentially, a 500 MHz scan is 5 contiguous chirps with a 120 nanosecond transition time between each chirp.

A 1 GHz sweep mode can be performed by incrementing the DDS 31.25 KHz every 100 nanoseconds for a total sweep time of 3.125 milliseconds. The input filters are preset at comb lines that yield continuous 1 GHz coverage. During comb line transitions, the output signal does go off for the 120 nanosecond transition time but the DDS does continue to increment to keep the slope of the sweep constant. A new comb line is selected every 200 MHz. It is important to equalize all channels, i.e., all filter channels and all comb line signals, in amplitude for the sweep mode at least.

A significant advantage of the embodiments disclosed herein is that rapid, continuous scanning of the frequency of the output signal can be achieved. This cannot be achieved in the closed loop prior art structures such as are manufactured by Hewlett Packard discussed in the background section above, because the closed loop feedback path bandwidth is too narrow to allow rapid scanning of the frequency of the YIG oscillator. These prior art embodiments typically open the feedback loop when scanning the YIG oscillator frequency and then close it again when the neighborhood of the desired frequency is reached. An additional 10–50 milliseconds goes by while the YIG oscillator stabilizes at some different frequency than it had when the loop was closed under the effects of the feedback.

The only way to take advantage of the very fast switching speeds of a DDS in changing frequency is to use an embodiment where the YIG filter center frequencies do not need to be altered, such as where multiple fixed frequency YIG passband filters are used.

Obviously, at least some of the embodiments disclosed herein are capable of multiple modes of operation such as frequency set, hop, chirp, scan and sweep. The design shown in FIG. 9 can achieve the same 100 nanosecond switching speed of vastly larger and more expensive prior art signal generators using digital multiply and divide architecture manufactured by Comstron.

The filtered output signal is amplified by an amplifier 300 with a 5–10 GHz bandwidth and 25 dB nominal gain.

Although the invention has been disclosed in terms of the preferred and alternative embodiments disclosed herein, those skilled in the art will appreciate numerous other modifications and alternatives which do not depart from the true spirit and scope of the invention. All such alternatives are intended to be included within the scope of the claims appended hereto.

What is claimed is:

1. An apparatus for generating a synthesized output signal at any frequency in a predetermined range of microwave frequencies including at least the frequencies from 5 gigahertz to 10 gigahertz with the ability to change the frequency of said synthesized output signal in about 100 nanoseconds, comprising:

a fixed frequency reference oscillator for generating a fundamental frequency reference signal, said fundamental frequency reference signal being at least 400 mHz at an offset of 100 kilohertz;

a comb line generator having an input and an output, said input for receiving said fundamental frequency reference signal, said comb line generator for generating at said output a plurality of harmonics of said fundamental frequency reference signal, each one of said plurality of harmonics of said fundamental frequency reference signal having a frequency which is an integer multiple of said fundamental frequency reference signal;

a first, fixed-tuned, switched, passband filter array having an input coupled to said output of said comb generator and having an output, comprising a plurality of fixed-tuned, permanent magnet biased YIG passband filters each of which has a signal input and a signal output and a different center frequency for its passband, said passband defining the frequencies of signals that can pass through said passband filter without substantial attenuation, said filter array including a first multiplexer means, said first multiplexer means for selectively coupling said fundamental frequency reference signal and said plurality of harmonics thereof appearing at said output of said comb line generator and said input of said first, fixed-tuned, switched, passband filter array to said signal input of a selectable one of said fixed-tuned, permanent magnet biased YIG passband filters and selectively coupling said signal output of the selected one of said fixed-tuned, permanent magnet biased YIG passband filters to said output of said first fixed-tuned, switched passband filter array, said first multiplexer means including gallium arsenide field effect transistor switching devices to perform high speed switching for selection of the appropriate one of said YIG passband filters, and further including a control signal input for receiving a signal which controls which of said plurality of fixed-tuned, permanent magnet biased YIG passband filters is selected for coupling to the output of said comb line generator by said first multiplexer means, each said fixed-tuned, permanent magnet biased YIG passband filters having the frequency of one of said plurality of harmonics within the passband thereof, said first fixed-tuned, switched, passband filter array for receiving said plurality of harmonics of said fundamental frequency reference signal and for filtering out all but a selected one of said plurality of harmonics, and for presenting the selected harmonic of said plurality of harmonics at said output of said first fixed-tuned, switched passband filter array;

a variable frequency local oscillator in the form of a direct digital synthesizer hereafter referred to as a DDS, for generating a variable frequency output signal at an output, said output signal having a frequency which can be varied from a minimum frequency up to a maximum frequency with the frequency difference between said minimum frequency and said maximum frequency being equal to at least one-half the frequency of said fundamental frequency reference signal, said variable frequency local oscillator being capable of switching to a new output frequency in 100 nanoseconds or less;

a mixer having an output and having a first input coupled to said output of said first fixed-tuned, switched passband filter array and having a second input coupled to said output of said variable frequency local oscillator so as to receive said variable frequency output signal, said mixer for mixing the output signal of said variable frequency local oscillator with said selected harmonic appearing at said first input and for generating an output signal at said output of said mixer which includes said selected harmonic as well as upper and lower sideband signals thereof having frequencies which are the sum and difference, respectively, of the frequency of said selected harmonic and the frequency of the output signal from said variable frequency local oscillator;

a second fixed-tuned, switched, passband filter array having an input and an output, comprising a plurality of fixed-tuned, permanent magnet biased YIG passband filters each of which has a signal input and a signal output and each of which has a different center frequency for its passband, each said passband defining the range of frequencies which can pass through said fixed-tuned, permanent magnet biased YIG passband filter without substantial attenuation, each said passband having a center frequency and a bandwidth selected to encompass a selected range of possible output frequencies for one sideband of one of said plurality of harmonics of said reference signal at said fundamental frequency, said second fixed-tuned, switched, passband filter array coupled to receive the output signal from said mixer through a second multiplexer means, said second multiplexer means for selectively coupling said mixer output to said signal input of a selectable one of said fixed-tuned, permanent magnet biased YIG passband filters having a passband which encompasses the frequency of the desired synthesized output signal, and for coupling the signal output of said selected one of said fixed tuned, permanent magnet biased YIG passband filters of said second fixed-tuned, switched passband filter array to a synthesizer output, said second multiplexer means including gallium arsenide field effect transistors for performing high speed switching in selection of the appropriate one of said fixed-tuned, permanent magnet biased YIG passband filters.

2. The apparatus of claim 1 further comprising a reverse slope equalizer coupled to receive said plurality of harmonics output by said comb line generator and for reducing the power of the lower order harmonics of said plurality of harmonics so that the power in the harmonics of said plurality of harmonics within a predetermined frequency range are within a more narrow amplitude range than otherwise would be the case, and further comprising a first power amplifier coupled to receive the output signal from said reverse slope equalizer and amplify said output signal and deliver the amplified output signal to the input of said first, fixed-tuned, switched, passband filter array, and further comprising a second power amplifier coupled between said output of said first fixed-tuned, switched, passband filter array and said first input of said mixer to amplify the filter signal delivered from said first fixed-tuned, switched, passband filter array to said mixer, and wherein said fixed frequency reference oscillator has a phase noise specification of −116 dbC/Hz or better at an offset of 100 kilohertz, and wherein said DDS local oscillator has a frequency resolution of 0.5 hertz or better.

3. The apparatus of claim 2 further comprising a third power amplifier coupled between said mixer output and said second multiplexer means for amplifying the signal output by said mixer, and further comprising a fourth power amplifier coupled between said second multiplexer means and said synthesizer output for amplifying the synthesized output signal.

4. The apparatus of claim 3 wherein said DDS local oscillator has a phase noise of approximately –90 dbC/Hz or less at 100 kilohertz offset, and wherein said first and second multiplexer means have switching speeds of approximately 100 nanoseconds or less.

5. The apparatus of claim 3 wherein said plurality of fixed-tuned permanent magnet biased YIG passband filters have attributes including a bandwidth, a Q and a passband having a center frequency, and wherein selection of said DDS local oscillator, said reference oscillator and selection of said bandwidth, Q and passband center frequencies of said plurality of fixed-tuned, permanent magnet biased YIG passband filters in said first and second fixed-tuned, switched passband filter arrays is such that said synthesized output signal has a maximum phase noise of –90 dbC at an offset of 100 kilohertz at an output frequency of 10 gigahertz with a spurious content of –60 dbc or better and a maximum harmonic output of –20 dbC.

6. The apparatus of claim 3 wherein said fixed frequency reference oscillator outputs a signal having a fundamental frequency of 500 mHz.

7. The apparatus of claim 2 wherein each of said first and second multiplexer means includes a pair of FET switching means for directing an incoming signal to the signal input of a selected one of said plurality of fixed-tuned, permanent magnet biased YIG passband filters, and for directing the output signal at the signal output of said selected one of said fixed-tuned, permanent magnet biased YIG passband filters onto a shared output signal line.

8. The apparatus of claim 7 wherein each of said FET switching means can switch in 100 nanoseconds or less, and further comprising a third power amplifier coupled between the output of said mixer and the input of said second fixed-tuned, switched, passband filter array, and a fourth power amplifier coupled between the output of said second fixed-tuned, switched, passband filter array and the output at which said synthesized output signal appears.

* * * * *